(12) United States Patent
Seo et al.

(10) Patent No.: US 11,646,336 B2
(45) Date of Patent: May 9, 2023

(54) IMAGE SENSOR

(71) Applicant: SAMSUNG ELECTRONICS CO., LTD., Suwon-si (KR)

(72) Inventors: Jaekwan Seo, Hwaseong-si (KR); Boram Kim, Suwon-si (KR); Nosan Park, Hwaseong-si (KR); Jungkuk Park, Anyang-si (KR); Jinsu Park, Suwon-si (KR); Seunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 16/941,835

(22) Filed: Jul. 29, 2020

(65) Prior Publication Data

US 2021/0193720 A1 Jun. 24, 2021

(30) Foreign Application Priority Data

Dec. 18, 2019 (KR) .......................... 10-2019-0169970

(51) Int. Cl.
*H01L 27/146* (2006.01)

(52) U.S. Cl.
CPC .. *H01L 27/14627* (2013.01); *H01L 27/14685* (2013.01); *H01L 27/14605* (2013.01); *H01L 27/14621* (2013.01)

(58) Field of Classification Search
None
See application file for complete search history.

(56) References Cited

U.S. PATENT DOCUMENTS

| 7,977,142 | B2 | 7/2011 | Jeong et al. |
| 9,520,429 | B2 | 12/2016 | Kim |
| 2005/0274968 | A1 | 12/2005 | Kuo et al. |
| 2006/0146415 | A1 | 7/2006 | Kim |
| 2006/0278906 | A1 | 12/2006 | Vaillant |
| 2008/0087921 | A1 | 4/2008 | Yu et al. |
| 2014/0218572 | A1* | 8/2014 | Ootsuka ............ H01L 27/14685 438/70 |
| 2015/0171125 | A1 | 6/2015 | Jangjian et al. |
| 2016/0240583 | A1 | 8/2016 | Yu et al. |
| 2017/0186795 | A1 | 6/2017 | Tsai et al. |
| 2017/0187948 | A1* | 6/2017 | Wang ........................ G02B 7/34 |
| 2017/0338265 | A1 | 11/2017 | Yoshiba et al. |
| 2018/0158864 | A1* | 6/2018 | Kim ................. H01L 27/14685 |

(Continued)

*Primary Examiner* — Ali Naraghi
(74) *Attorney, Agent, or Firm* — Sughrue Mion, PLLC

(57) ABSTRACT

Provided is an image sensor including a semiconductor substrate including a first surface and a second surface and a plurality of pixel regions spaced apart, the plurality of pixel regions including a first region including a plurality of image pixels configured to generate image data and a second region including a plurality of phase difference detection pixels configured to perform autofocusing, a first grid pattern including a plurality of groove portions disposed on the second surface, a plurality of first microlenses selectively disposed on bottom surfaces of the plurality of groove portions corresponding to at least one of the first region and the second region, a plurality of color filters filling the plurality of groove portions, respectively, a second grid pattern superimposed on the first grid pattern, and a plurality of second microlenses separated by the second grid pattern and disposed on the plurality of color filters, respectively.

20 Claims, 13 Drawing Sheets

(56) References Cited

U.S. PATENT DOCUMENTS

| | | | |
|---|---|---|---|
| 2019/0148434 A1* | 5/2019 | Hsu | H01L 27/14629 257/432 |
| 2019/0267420 A1* | 8/2019 | Lee | H01L 27/14627 |

* cited by examiner

IMAGE SENSOR

CROSS-REFERENCE TO RELATED APPLICATIONS

This application claims priority from Korean Patent Application No. 10-2019-0169970 filed on Dec. 18, 2019, in the Korean Intellectual Property Office, the disclosure of which is incorporated herein by reference in its entirety.

BACKGROUND

1. Field

Embodiments of the disclosure relate to an image sensor.

2. Description of Related Art

An image sensor is a semiconductor device converting an optical image into an electrical signal. Recently, with the development of the computing and telecommunications industries, demand for an image sensor having improved performance in various fields such as digital cameras, camcorders, security cameras, medical micro cameras, and the like, is increasing. Accordingly, demand for performance of an image capturing device or an image sensor included in the image capturing device is increasing.

Recently, in order to achieve a fast focus detection speed of an image sensor, a hybrid autofocus (AF) method that performs autofocusing using a portion of an image sensor as an AF sensor has been widely used.

SUMMARY

One or more embodiments provide an image sensor capable of improving accuracy of autofocusing by making a focal length of an image pixel of an image sensor different from a focal length of a phase difference detection pixel.

According to an aspect of an embodiment, there is provided an image sensor including a semiconductor substrate including a first surface and a second surface on which light is incident and disposed opposite to the first surface, and including a plurality of pixel regions spaced apart from each other, the plurality of pixel regions including a first region including a plurality of image pixels configured to generate image data and a second region including a plurality of phase difference detection pixels configured to perform autofocusing, a first grid pattern including a plurality of groove portions disposed on the second surface corresponding to the plurality of pixel regions, respectively, a plurality of first microlenses selectively disposed on bottom surfaces of the plurality of groove portions corresponding to at least one of the first region and the second region, a plurality of color filters filling the plurality of groove portions, respectively, a second grid pattern superimposed on the first grid pattern, and a plurality of second microlenses separated by the second grid pattern, the plurality of second microlenses being disposed on the plurality of color filters, respectively.

According to another aspect of an embodiment, there is provided an image sensor including a semiconductor layer including a plurality of pixel regions respectively including a photoelectric conversion portion, the plurality of pixel regions including a first region including a plurality of image pixels configured to generate image data and a second region including a plurality of phase difference detection pixels configured to perform autofocusing, a plurality of color filters disposed on the semiconductor layer corresponding to the plurality of pixel regions, respectively, a plurality of first microlenses disposed between the semiconductor layer and the plurality of color filters, and corresponding to the plurality of pixel regions, respectively, and a plurality of second microlenses disposed on the plurality of color filters opposite to the plurality of first microlenses and corresponding to the plurality of pixel regions, respectively, wherein the plurality of first microlenses include a first group disposed in the first region and having a first focal length and a second group disposed in the second region and having a second focal length that is different from the first focal length.

According to yet another aspect of an embodiment, there is provided an image sensor including a semiconductor substrate including a plurality of pixel regions spaced apart from each other, and including a first surface and a second surface on which light is incident and opposite to the first surface, the plurality of pixel regions including an image detection region configured to generate image data and a phase difference detection region configured to perform autofocusing, a grid pattern including a plurality of groove portions disposed on the second surface of the semiconductor substrate corresponding to the plurality of pixel regions, respectively, a plurality of first microlenses disposed in the plurality of groove portions, a plurality of color filters disposed on the plurality of first microlenses, respectively, in the plurality of groove portions, and a plurality of second microlenses disposed on the plurality of color filters, the plurality of second microlenses being spaced apart from each other and corresponding to the plurality of pixel regions, respectively, wherein the plurality of first microlenses include a first group disposed in the image detection region and having a first focal length, and a second group disposed in at least part of the phase difference detection region and having a second focal length that is different from the first focal length.

BRIEF DESCRIPTION OF DRAWINGS

The above and/or other aspects, features, and advantages of the embodiments will be more clearly understood from the following detailed description, taken in conjunction with the accompanying drawings, in which.

DETAILED DESCRIPTION

Hereinafter, example embodiments will be described with reference to the accompanying drawings.

Figure 1:
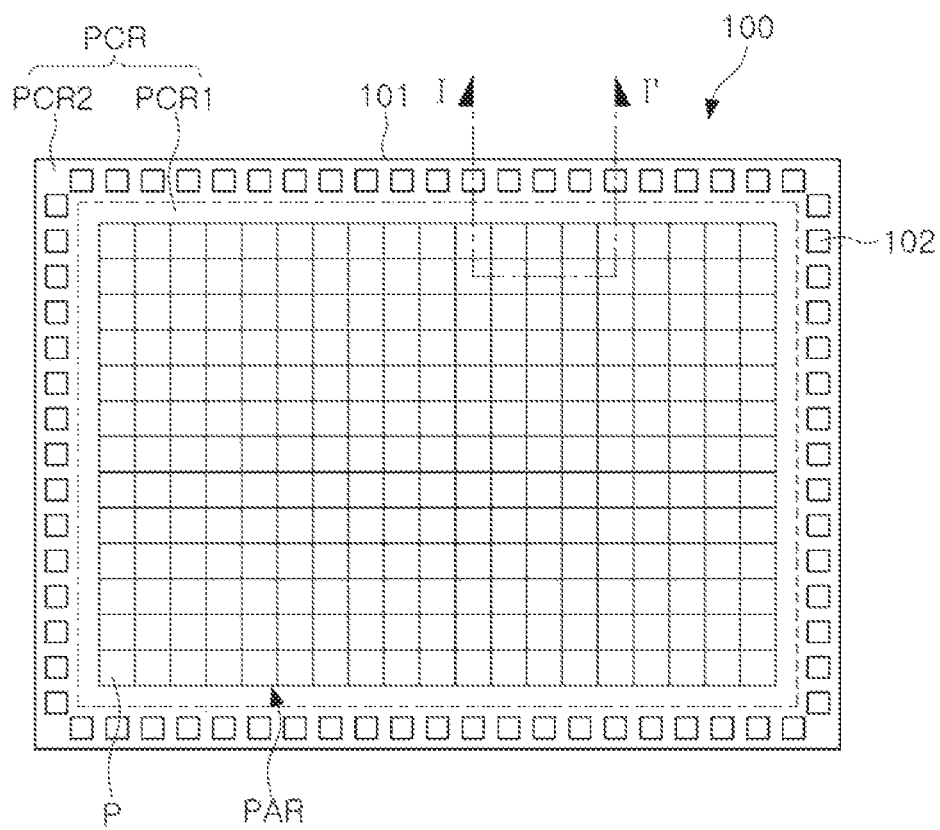
FIG. 1 is a plan view of an image sensor according to an example embodiment.
Figure 2:
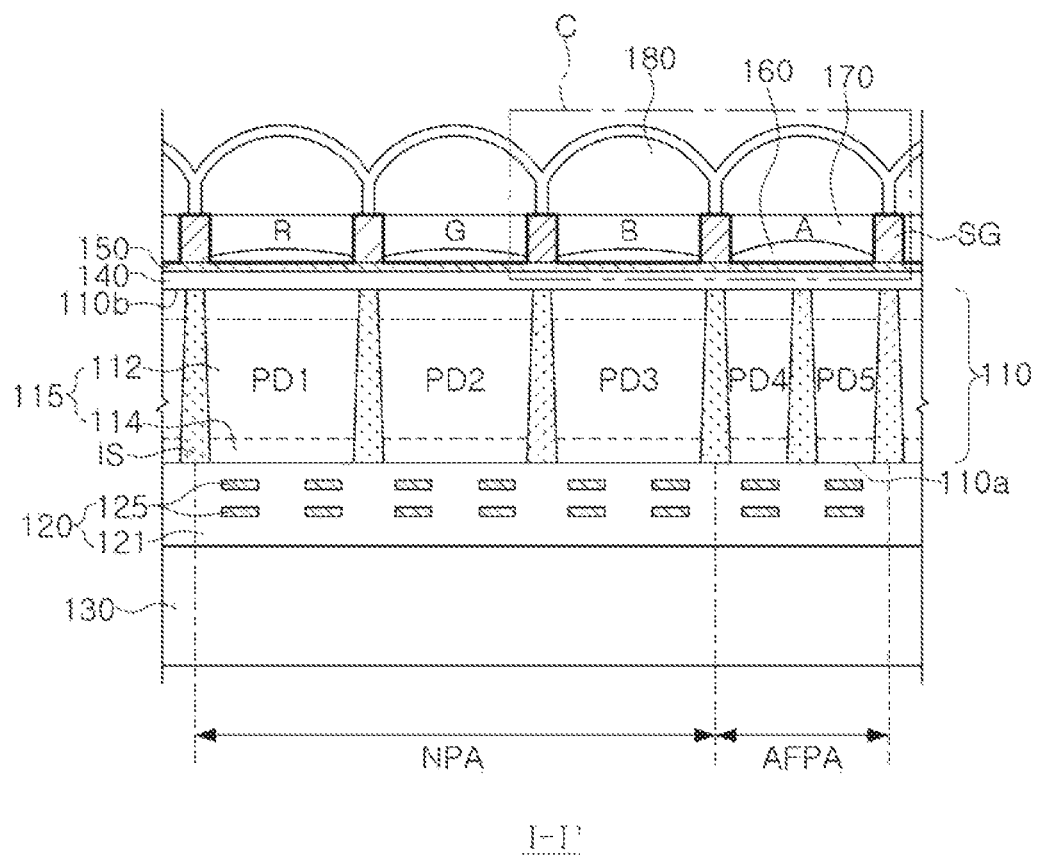
FIG. 2 is a cross-sectional view taken along line I-I' of FIG. 1.
Figure 3:
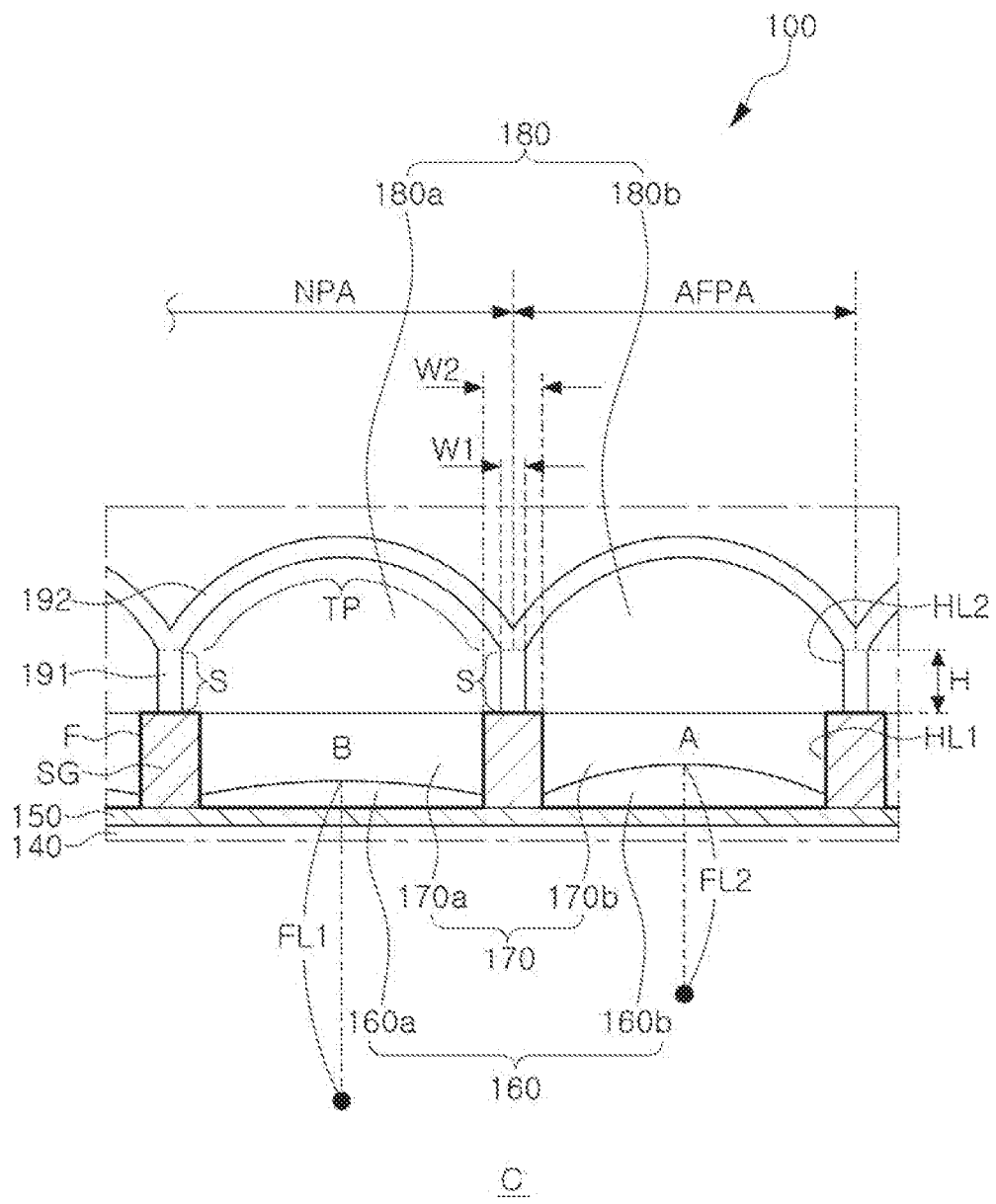
FIG. 3 is an enlarged view of portion C of FIG. 2.

Referring to FIGS. 1, 2, and 3, an image sensor according to an example embodiment will be described. FIG. 1 is a plan view of an image sensor according to an example embodiment, FIG. 2 is a cross-sectional view of an image sensor according to an example embodiment, and FIG. 3 is an enlarged view of portion C of FIG. 2.

Referring to FIG. 1, an image sensor 100 according to the example embodiment may include a pixel array region PAR and a peripheral circuit region PCR implemented in a substrate 101. Referring to FIG. 2, the pixel array region PAR may include a first area NPA including an image pixel and a second area AFPA including a phase difference detection pixel. The first area NPA may be a normal pixel area, and an image pixel may be a pixel configured to generate image data of incident light. The second area AFPA may be a phase difference detection area, and a phase difference detection pixel may be a pixel configured to perform autofocusing by acquiring phase difference data based on incident light.

Referring to FIG. 1, the peripheral circuit region PCR includes a logic region PCR1 and a pad region PCR2, and the peripheral circuit region may be a region other than the pixel array region PAR in the substrate 101 forming the image sensor 100. The pad region PCR2 includes a plurality of pads 102, and the pixel array region PAR includes a plurality of unit pixels P arranged in a matrix form.

As illustrated in FIG. 1, the logic region PCR1 may be disposed along an edge of the pixel array region PAR. The logic region PCR1 is illustrated as being positioned along all four corners of the pixel array region PAR, but embodiments are not limited thereto. For example, the logic region PCR1 may be disposed along two or three corners.

The logic region PCR1 may be implemented with electronic devices including a plurality of transistors. The logic region PCR1 may be configured to provide a constant signal to each unit pixel P of the pixel array region PAR or to control an output signal. For example, the logic region PCR1 may include a timing generator, a row decoder, a column decoder, a row driver, a correlated double sampler, an analog to digital converter, a latch portion, and the like.

Referring to FIG. 2, an image sensor 100 may include a semiconductor layer 110, a wiring layer 120, a carrier substrate 130, a metal barrier layer 140, a fixed charge layer 150, a first grid pattern SG, a second grid pattern 191, a color filter 170, a first microlens 160, and a second microlens 180. The image sensor 100 may further include a fixed charge layer 150 disposed between the metal barrier layer 140 and the color filter 170.

The semiconductor layer 110 may include, for example, silicon (Si). Although not limited thereto, the semiconductor layer 110 may be a semiconductor element such as germanium (Ge), or a compound semiconductor such as silicon carbide (SiC), gallium arsenide (GaAs), indium arsenide (InAs), and indium phosphide (InP), or may include a silicon on insulator (SOI) structure or a buried oxide (BOX) layer.

The semiconductor layer 110 may include a first surface 110a and a second surface 110b opposite to the first surface 110a. Accordingly to an example embodiment, the first surface 110a may be a lower surface of the semiconductor layer 110 and the second surface 110b may be an upper surface of the semiconductor layer 110, respectively. The wiring layer 120 may be disposed on the first surface 110a of the semiconductor layer 110, and light may be incident through the second surface 110b of the semiconductor layer 110.

The semiconductor layer 110 may be a silicon substrate or an epitaxial layer formed on the silicon substrate. The photoelectric conversion portion 115 including a plurality of photoelectric conversion elements may be formed in the semiconductor layer 110. According to an example embodiment, a photoelectric conversion portion may include three photoelectric conversion elements PD1, PD2, and PD3 disposed in a first region NPA, and two photoelectric conversion elements PD4 and PD5 disposed in a second region AFPA. The photoelectric conversion elements PD1, PD2, and PD3 disposed in the first region NPA may generate photoelectrons in response to light incident from the second surface 110b. In addition, the photoelectric conversion elements PD4 and PD5 disposed in the second area AFPA may separate light incident from the second surface 110b into different phases, and automatically detect a focus of each unit pixel P by detecting a phase angle at which intensities of image signals respectively detected coincide. Each photoelectric conversion portion 115 may be implemented as a photodiode, a phototransistor, a photogate, or a pinned photodiode.

The photoelectric conversion portion 115 may include first impurity regions 112 located inside the semiconductor layer 110 and second impurity regions 114 located to be adjacent to or abut the first surface 110a of the semiconductor layer 110. A pixel isolation layer IS may be formed between adjacent photoelectric conversion portions 115. Each photoelectric conversion portion 115 may be separated by the pixel isolation layer IS. The pixel isolation layer IS may be formed in a mesh form in a plane when viewed from above. The pixel isolation layer IS may be formed by filling an insulating material such as an oxide in a deep trench penetrating the first surface 110a and the second surface 110b of the semiconductor layer. The pixel isolation layer IS may be formed of a material having a lower refractive index than a material forming the semiconductor layer 110.

The pixel isolation layer IS employed in the example embodiment may be formed in a form of the deep trench penetrating the first surface 110a and the second surface 110b to effectively reduce optical crosstalk and electrical crosstalk. Here, the optical crosstalk may be a phenomenon in which incident light through the color filter 170 is transferred to adjacent photoelectric conversion elements, and the electrical crosstalk may be a phenomenon in which electron-hole pairs generated in a depletion region of a photoelectric conversion element are transferred to photoelectric conversion elements.

The wiring layer 120 may be disposed on the first surface 110a of the semiconductor layer 110. The wiring layer 120 may include an interlayer insulating layer 121 and a metal wiring 125. For example, the interlayer insulating layer 121 may include an oxide film such as a silicon oxide or a composite film of an oxide film and a nitride film. The metal wiring 125 may be provided as an electrical wiring required for an operation of the photoelectric conversion portion 115 formed in the semiconductor layer 110. The metal wiring 125 may be divided into multiple layers, and may be divided into a gate or word line level wiring and a bit line level wiring.

The metal barrier layer 140 may be disposed on the second surface 110b of the semiconductor layer 110. The metal barrier layer 140 may be made of titanium (Ti)/titanium nitride (TiN).

The fixed charge layer 150 may be disposed above the metal barrier layer 140. In the fixed charge layer 150, holes may be accumulated on a surface of the second surface 110b of the semiconductor layer 110 to more effectively reduce occurrence of dark currents or formation of white spots. The fixed charge layer 150 may include a metal oxide or a metal fluoride including at least one metal selected from a group consisting of hafnium (Hf), zirconium (Zr), aluminum (Al), tantalum (Ta), titanium (Ti), yttrium (Y), and lanthanoid (La).

The first grid pattern SG may be disposed on the fixed charge layer 150. The first grid pattern SG may be configured to minimize optical interference between light incident to the color filter 170. When viewed from above, the first grid pattern SG may have a partition structure separating the color filters 170 from each other. In the first grid pattern SG, a groove portion HL1 may be disposed to correspond to each unit color filter 170, and a red filter R, a green filter G, and a blue filter B may be disposed in each of the groove portion HL1, respectively.

Figure 4:
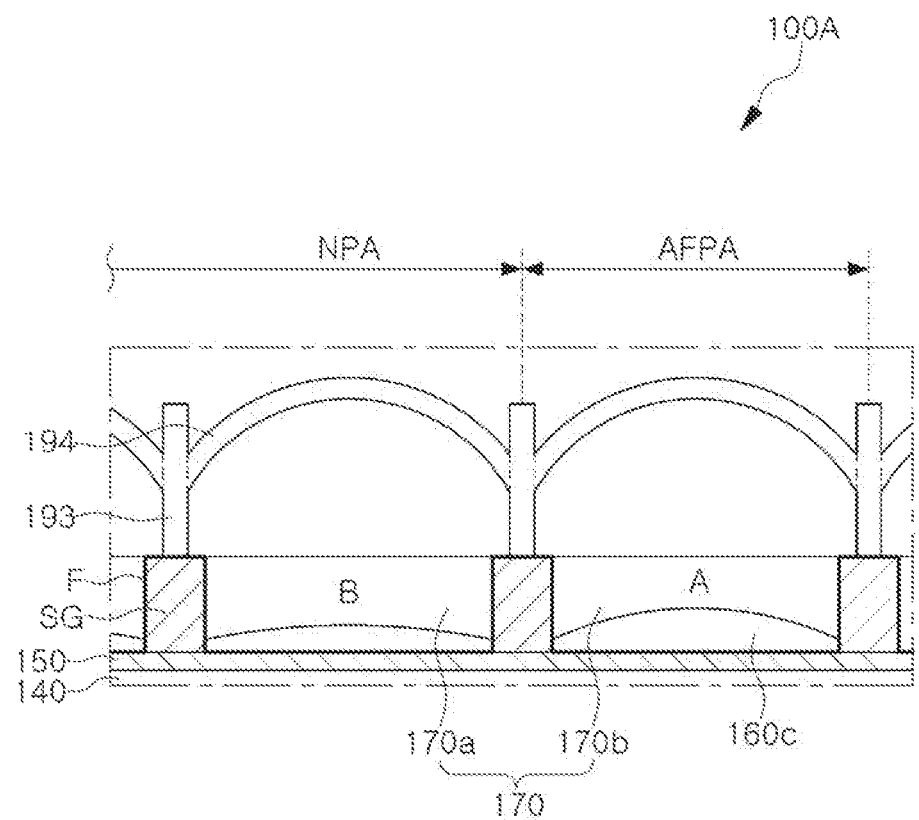
FIG. 4 is a cross-sectional view of an image sensor according to an example embodiment.

The first grid pattern SG may be formed of a low refractive index material having a refractive index of 1.3 or less. For example, the first grid pattern SG may be formed of a material such as silicon dioxide ($SiO_2$) or silicon oxynitride (SiON). According to some example embodiments, as illustrated in FIG. 4, an insulating layer F may be further disposed on a surface of the first grid pattern SG. According to an example embodiment, the insulating layer F may extend from the upper surface and the side surfaces of the first grid pattern SG to an upper surface of the fixed charge layer 150 forming a bottom surface of the groove portion HL1. The insulating layer F may include an insulating material such as aluminum oxide ($Al_2O_3$).

The first microlens 160 may be disposed on the bottom surface of the groove portion HL1 of the first grid pattern SG. According to an example embodiment, the first microlens 160 may be selectively disposed only in the groove portions HL1 of one area of the first area NPA and the second area AFPA. However, embodiments are not limited thereto. For example, the first microlens 160 may be disposed in the groove portions HL1 of both the first area NPA and the second area AFPA.

In addition, the first microlens 160 may be disposed in both the first area NPA and the second area AFPA. In this case, first microlenses 160a and 160b respectively disposed in the first area NPA and the second area AFPA may have different surface shapes to have different focal lengths. For example, as illustrated in FIG. 3, the first microlens 160b disposed in the second area AFPA may have a greater thickness or a smaller radius of curvature than the first microlens 160a disposed in the second area AFPA.

FIG. 3 illustrates that the first microlens 160 is disposed in both the first area NPA and the second area AFPA, and that the first microlens 160b disposed in the second area AFPA has a greater thickness or a smaller radius of curvature than the first microlens 160a disposed in the first area NPA. Thereby, the first microlens 160a disposed in the first area NPA and the first microlens disposed in the second area AFPA may provide different focal lengths FL1 and FL2, respectively. The color filter 170a disposed in the first area NPA and the color filter 170b disposed in the second area AFPA may be disposed to cover the first microlenses 160a and 160b, respectively.

The first microlens 160 may be formed by disposing and reflowing a light transmissive material layer in the groove portion HL1 of the first grid pattern SG. Thereby, a naturally convex lens surface may be formed on the upper surface of the first microlens 160. The light transmissive material layer disposed in the groove portion HL1 may be melted in a reflow process to fill the bottom surface of the groove portion HL1 of the first grid pattern SG, such that a side surface of the first microlens 160 may be formed to contact with a sidewall of the groove portion HL1 without a gap.

Since the first area NPA configured to generate image data and the second area AFPA configured to perform autofocusing have different focal lengths due to the difference between the photoelectric conversion elements disposed below each of the first area NPA and the second area AFPA, there is a need to configure different focal lengths of the microlenses disposed in the first area NPA and the second area AFPA. However, in a manufacturing process, a second microlens 180 disposed above the color filter 170 is formed after the logic region PCR1 is formed in the peripheral circuit region PCR. When an etching process for surface processing of the second microlens 180 is performed, the logic region PCR1 may be damaged. Therefore, it is practically difficult to make the focal lengths of the first area NPA and the second area AFPA different by the surface processing of the second microlens 180. In an example embodiment, the first microlens 160 may be formed below the color filter 170, and a surface of the first microlens 160 may be processed in a step before forming the logic region PCR1. Therefore, the focal lengths FL1 and FL2 of the first area NPA and the second area AFPA, respectively, may be different while preventing or reducing damage to the logic area PCR1.

The color filter 170 may be disposed in the groove portion HL1 of the first grid pattern SG, respectively. The color filter 170 may be separated by the first grid pattern SG, respectively, thereby minimizing optical interference. When the first microlens 160 is disposed on the bottom surface of the groove portion HL1 of the first grid pattern SG, the color filter 170 may be disposed to cover the first microlens 160. The color filter 170 may be a Bayer pattern having a red filter R, a green filter G, or a blue filter B for each unit pixel. The red filter R may pass wavelengths of a red region among wavelengths of a visible region of light. The green filter G may pass wavelengths of a green region among wavelengths of a visible region of light. The blue filter B may pass wavelengths of a blue region among wavelengths of a visible region of light. The red filter R, the green filter G, and the blue filter B may be disposed adjacent to each other in the first region NPA, and any one of the red filter R, the green filter G, and the blue filter B may be disposed in the second region AFPA.

In another example embodiment, the color filter 170 may be a cyan filter, a magenta filter or a yellow filter. The cyan filter may pass wavelengths in a 450 nm to 550 nm region among the wavelengths in the visible region of light. The magenta filter may pass wavelengths in a 400 nm to 480 nm region among the wavelengths in the visible region of light. The yellow filter may pass wavelengths in a 500 nm to 600 nm region among the wavelengths in the visible region of light.

According to an example embodiment, a buffer layer may be disposed between the metal barrier layer 140 and the color filter 170 to remove or reduce a stepped portion and provide a smooth surface.

A second grid pattern 191 having the groove portion HL2 may be disposed above the color filter 170. The second grid pattern 191 may be disposed to have a thickness W1 smaller than the thickness W2 of the first grid pattern SG in an area overlapping the first grid pattern SG. The second microlens 180 may be disposed in the groove portion HL2 of the second grid pattern 191. The second grid pattern 191 may have a partition structure that separates the second microlenses 180 from each other. The second grid pattern 191 may be made of a light transmissive material. According to an example embodiment, the second grid pattern 191 may be formed of a high refractive index material having a refractive index of 1.7 or more. For example, the second grid pattern 191 may be formed of polymer or a metal oxide. A sidewall of the second grid pattern 191 may have a height H of 2000 Å to 3000 Å. When the height H of the second grid pattern 191 is less than 2000 Å, an effect as a partition wall for preventing optical crosstalk between unit pixels may be substantially lost. In addition, when the height H of the second grid pattern 191 exceeds 3000 Å, diffuse reflection may occur on the sidewall thereof, thereby reducing the accuracy of the image data and the phase difference data acquired in the unit pixel.

The second microlens 180 may be disposed above the color filter 170, and may be formed to be convex upwardly while filling the groove portions HL2 of the each of the second grid patterns 191. The second microlens 180 may be formed by disposing and reflowing a light transmissive material layer in the groove portion HL2 of the second grid pattern 191. Thereby, the side surface S of the second microlens 180 may be formed to be in contact with the second grid pattern 191, and a naturally convex lens surface may be formed on the top surface TP. Since the light transmissive material layer disposed in the groove portion HL2 is melted in the reflow process to fill the bottom surface of the groove portion HL2 of the second grid pattern 191, a side surface of the second microlens 180 may be formed to contact the sidewall of the groove portion HL2 without gap.

According to example embodiments, a protective layer 192 covering the second microlens 180 may be further disposed on the top surface TP of the second microlens 180. The protective layer 192 may be disposed to contact the second grid pattern 191. When the second grid pattern 191 is made of a light transmissive material, the protective layer 192 may be made of the same material as the second grid pattern 191.

FIG. 4 shows an image sensor 100A according to an example embodiment. In the example embodiment, the same configuration as the above-described example embodiment is shown with the same reference numerals. The description of the same configuration as the above-described example embodiment will be omitted, and a description of differences will be provided hereinafter.

In the example embodiment as illustrated in FIG. 4, a second grid pattern 193 protrudes above the protective layer 194, compared to the above-described example embodiment illustrated in FIG. 3. In this case, the optical crosstalk between adjacent unit pixels P may be further reduced.

Figure 5:
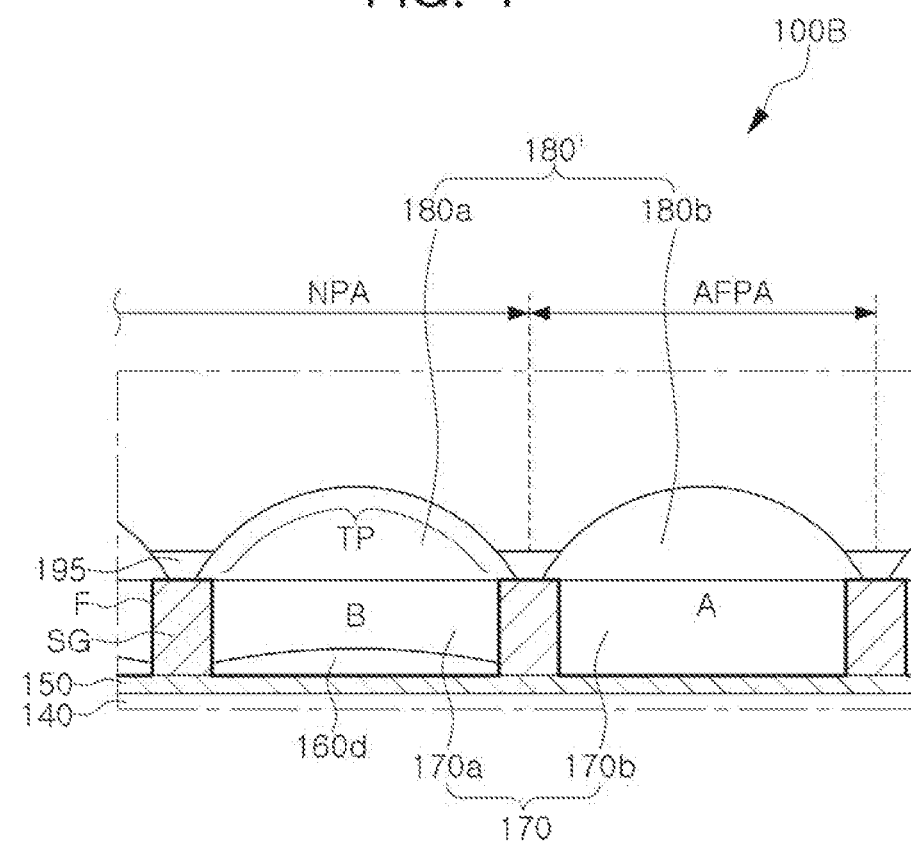
FIG. 5 a cross-sectional view of an image sensor according to an example embodiment.

FIG. 5 shows an image sensor 100B according to an example embodiment. In the example embodiment, the same configuration as the above-described example embodiment is shown with the same reference numerals. The description of the same configuration as the above-described example embodiment will be omitted, and a description of differences will be provided hereinafter.

In the example embodiment as illustrated in FIG. 5, a second microlens 180' has only a top surface TP without a side surface, and a second grid pattern 195 may be disposed to cover a portion of the top surface TP of the second microlens 180'. According to the example embodiment as illustrated in FIG. 5, a first microlens 160d is selectively disposed only in the first area NPA.

Next, a manufacturing process of the image sensor 100 of FIG. 2 described above will be described with reference to FIGS. 6 to 13. FIGS. 6 to 13 are cross-sectional views of main processes of a manufacturing process of an image sensor 100 according to an example embodiment.

Figure 6:
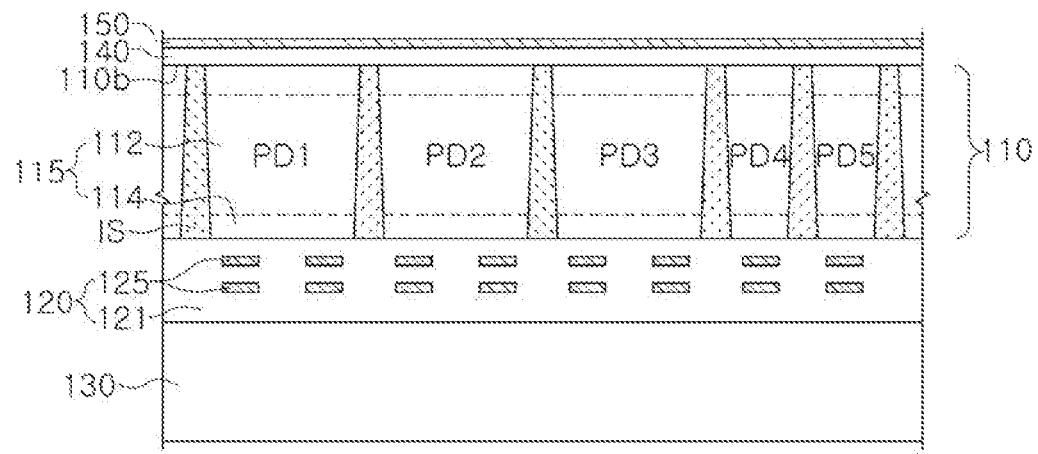
FIGS. 6, 7, 8, 9, 10, 11, 12, and 13 are cross-sectional views of main processes of a manufacturing process of an image sensor according to an example embodiment.

As shown in FIG. 6, a structure in which the wiring layer 120 and the semiconductor layer 110 are formed on the carrier substrate 130 may be provided, and the metal barrier layer 140 and the fixed charge layer 150 may be sequentially formed on the second surface 110b of the semiconductor layer 110. Since the carrier substrate 130, the wiring layer 120, and the semiconductor layer 110 have been described in the above-described example embodiment, detailed description thereof will be omitted. The metal barrier layer 140 may be formed by depositing Ti/TiN on the semiconductor layer 110. The fixed charge layer 150 may be formed by depositing a metal oxide or metal fluoride containing at least one metal selected from a group consisting of Hf, Zr, Al, Ta, Ti, Y and La on the metal barrier layer 140.

Figure 7:
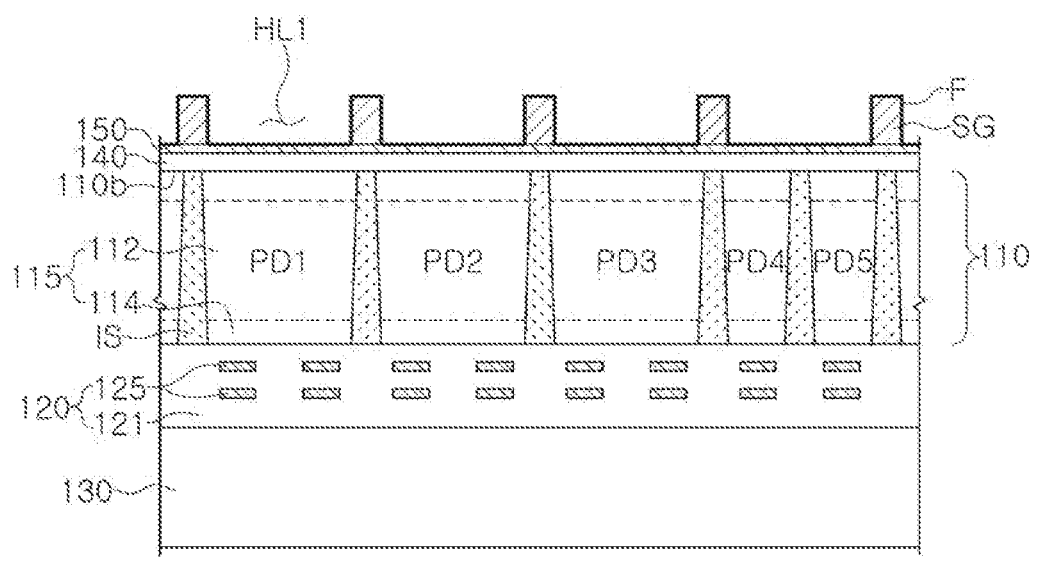

Next, as shown in FIG. 7, the first grid pattern SG having the groove portion HL1 corresponding to each of the photoelectric conversion elements PD1 to PD5 of the semiconductor layer 110 may be formed on the fixed charge layer 150. The first grid pattern SG may be provided in a matrix form that separates each of the photoelectric conversion portions 115. The first grid pattern SG may be formed of a low refractive index material having a refractive index of 1.3 or less. For example, the first grid pattern SG may be formed of a material such as $SiO_2$, or SiON. According to an example embodiment, an insulating layer F including an insulating material such as $Al_2O_3$ may be formed on the first grid pattern SG. The insulating layer F may be formed to extend from the surface of the first grid pattern SG to extend the top surface of the fixed charge layer 150 forming the bottom surface of the groove portion HL1, such that it may be disposed to cover the side surface and the bottom surface of the groove portion HL1.

Figure 8:
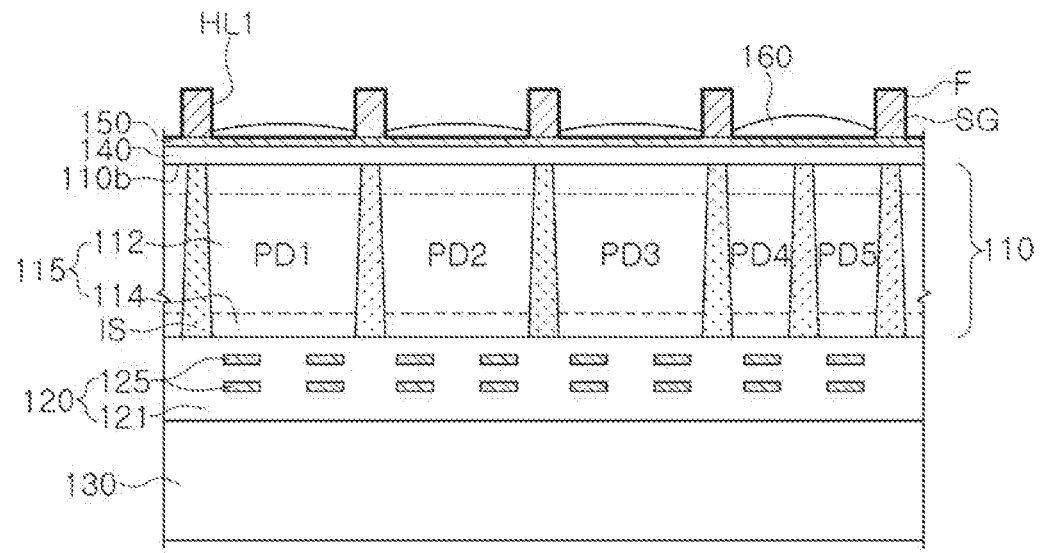

Next, as shown in FIG. 8, the first microlens 160 may be formed on the bottom surface of the groove portion HL1. The first microlens 160 may form a light transmissive material layer in the groove portion HL1 and reflow to allow the lens surface to be naturally formed on the top surface by surface tension. According to an example embodiment, a surface shape of the first microlens 160 may be adjusted by performing an additional etching process after the reflow. Thereby, it is also possible to adjust optical characteristics of each of the first microlens 160. The etching process may be selectively performed according to a region in which the first microlens 160 is disposed. For example, the surface shape of the first microlens 160 disposed in the first area NPA may be different from the surface shape of the first microlens 160 disposed in the second area AFPA. As a result, the focal lengths of the first microlenses 160 disposed in the first area NPA and the second area AFPA may be different from each other.

Figure 9:
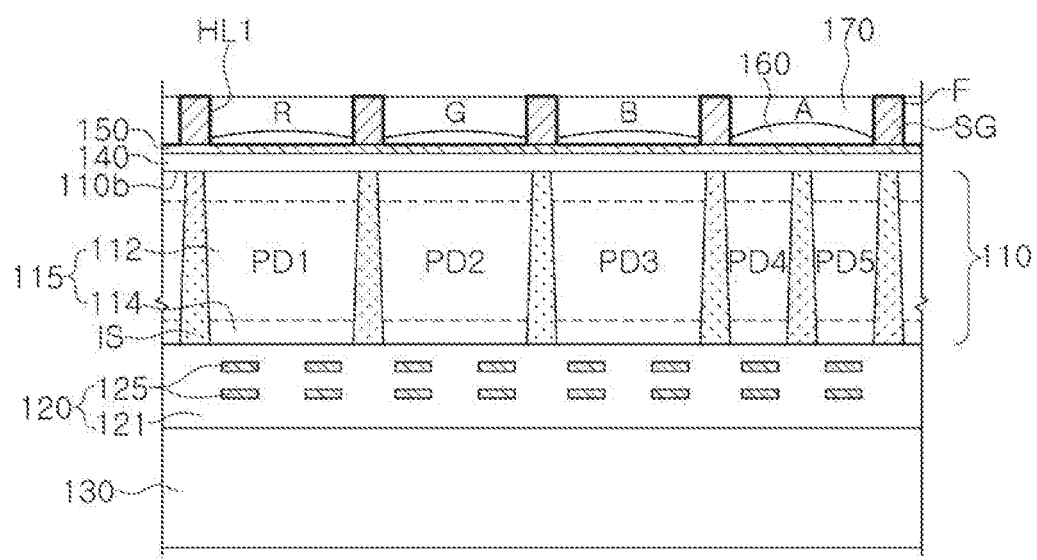

Next, as shown in FIG. 9, the color filters 170 may be formed in the groove portion HL1 of the first grid pattern SG, respectively. A red filter R, a green filter G, and a blue filter B may be formed adjacent to each other in the first area NPA, and any one filter A of the red filter R, the green filter G, and the blue filter B may be formed in the second area AFPA.

Figure 10:
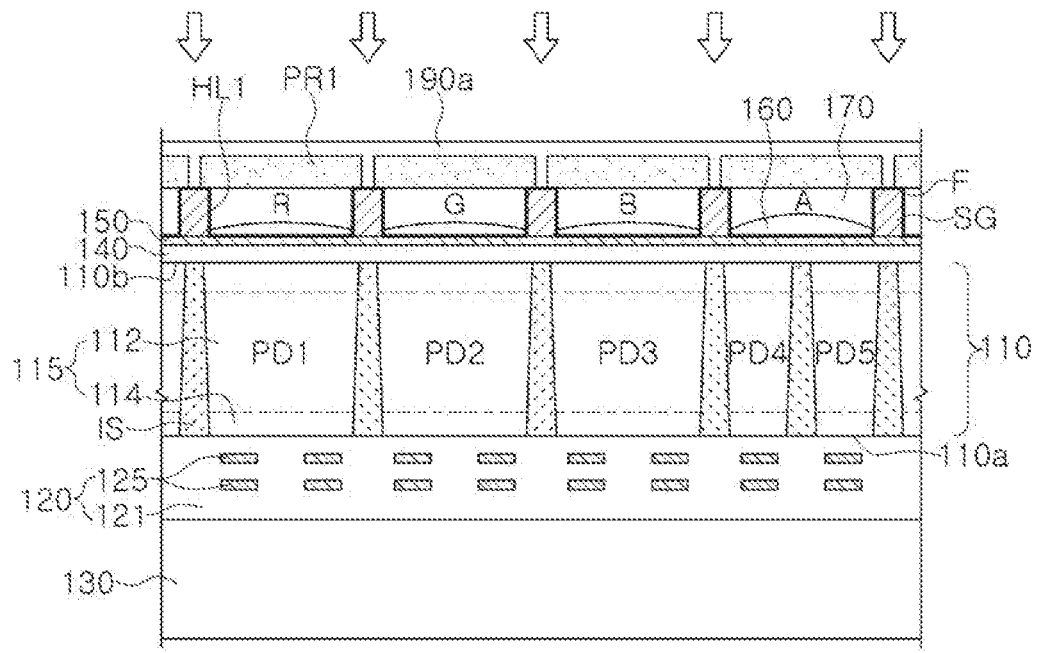
Figure 11:
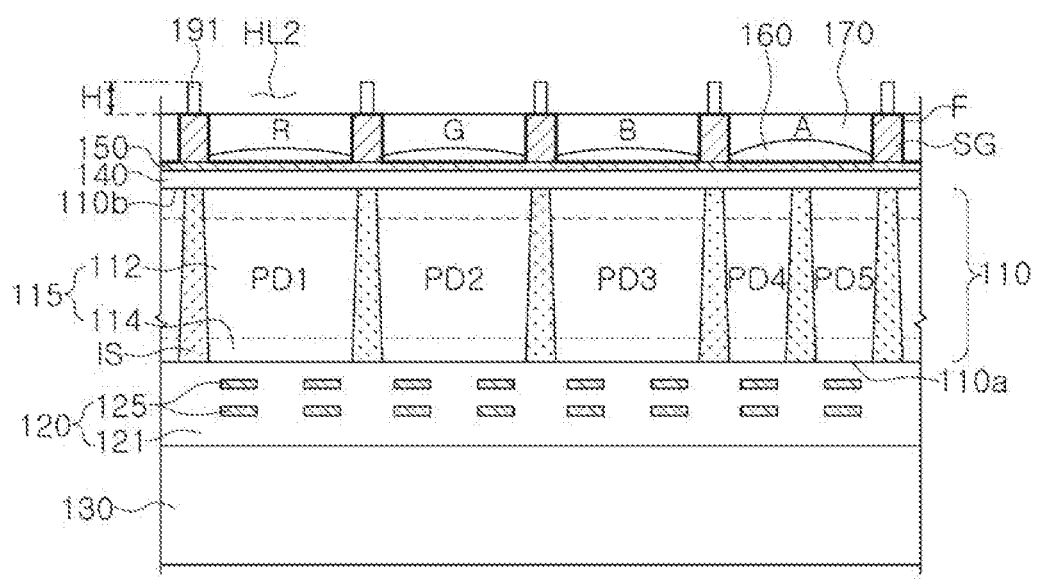

Next, referring to FIG. 10, a photoresist PR1 may be applied and masked on the color filter 170, and an insulating layer 190a may be formed to entirely cover the photoresist PR1. In this case, the photoresist PR1 may be formed to have a size that may cover the groove portion HL1 of the first grid pattern SG, such that the second grid pattern 191 formed in a subsequent process can only be selectively formed in a region overlapping the first grid pattern SG. The insulating layer 190a may be formed of a polymer or a metal oxide having a refractive index of 1.7 or more. Subsequently, when an entire surface of the insulating layer 190a is etched, as shown in FIG. 11, the second grid pattern 191 having the groove portion HL2 may be formed. The etching process may be adjusted such that the sidewall of the second grid pattern 191 has a height H of 2000 Å to 3000 Å.

Figure 12:
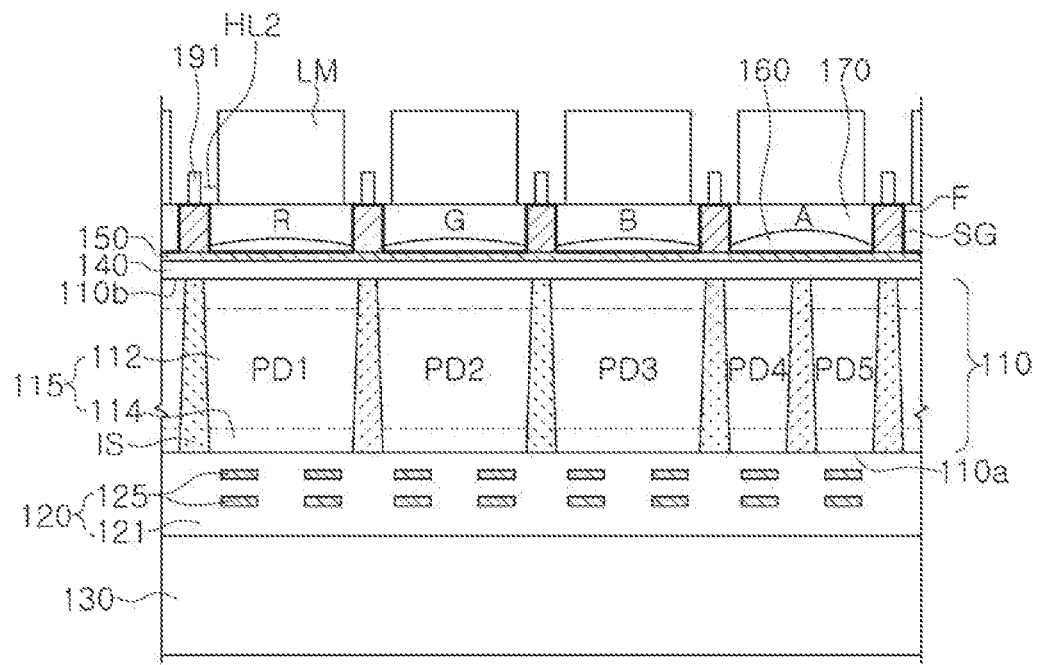
Figure 13:
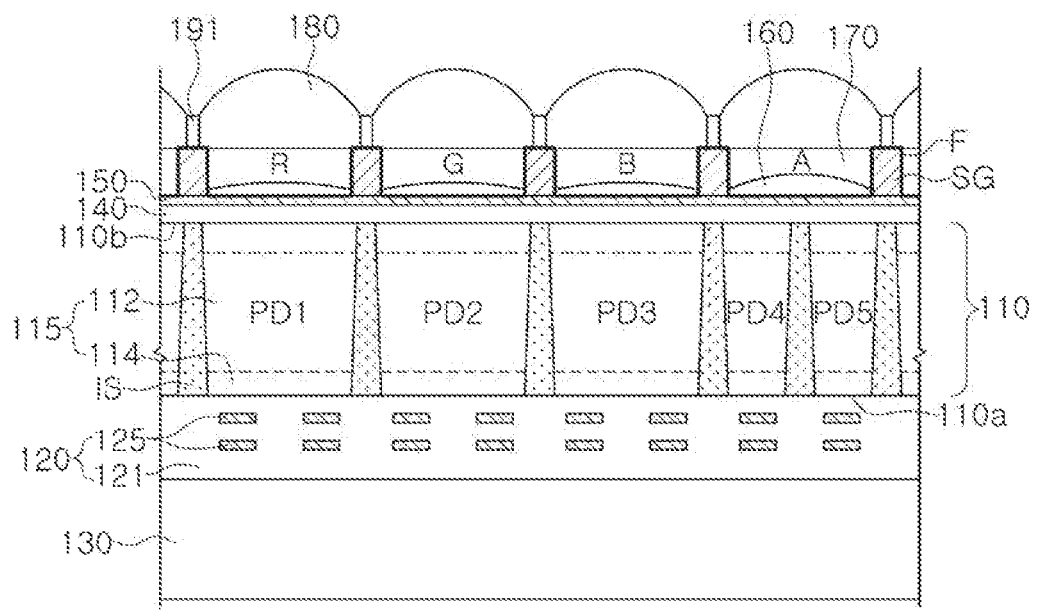

Next, as shown in FIG. 12, a light transmissive material layer LM may be formed and reflowed in the groove portion HL2 of the second grid pattern 191, and as shown in FIG. 13, the second microlens 180 in which a lens surface is formed on a top surface thereof may be formed. According to an example embodiment, a protective layer for protecting the second microlens 180 may be further formed on the top surface of the second microlens 180.

Figure 14:
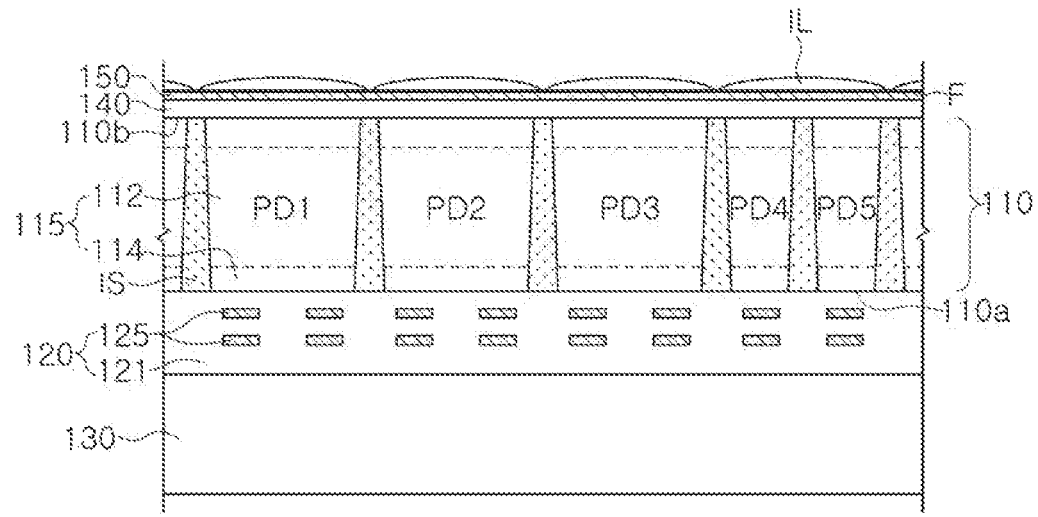
FIGS. 14, 15, 16, 17, 18, and 19 are cross-sectional views of main processes of a manufacturing process of an image sensor according to an example embodiment.

Next, a manufacturing process of an example embodiment of the image sensor 100 of FIG. 2 described above will be described with reference to FIGS. 14 to 19. FIGS. 14 to 19 are cross-sectional views of main processes of a manufacturing process of an image sensor according to an example embodiment. Since the process of FIG. 14 is performed after FIG. 6 of the above-described example embodiment, description of FIG. 6 will be omitted.

As illustrated in FIG. 14, a first microlenses IL disposed to correspond to each of the photoelectric conversion elements PD1 to PD5 may be formed on the fixed charge layer 150. The first microlens IL may be formed by forming and reflowing a light transmissive material layer on the fixed charge layer 150. According to an example embodiment, the first microlens 160 may be directly formed on the fixed charge layer 150 without a grid pattern.

Figure 15:
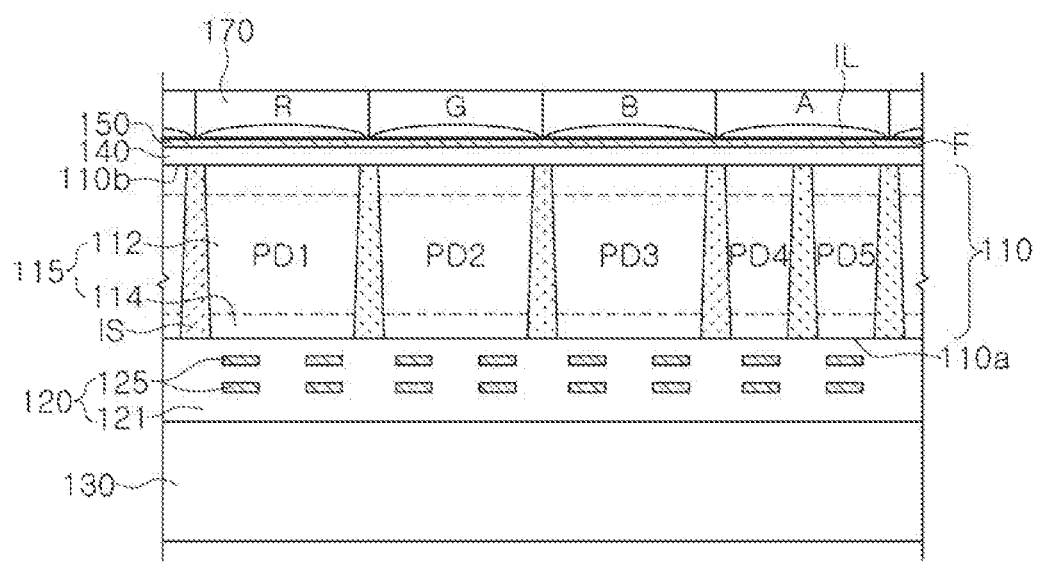

Next, as shown in FIG. 15, a color filter 170 may be formed to cover the first microlens IL. The color filter 170 may be formed to be distinguished for each unit pixel.

Figure 16:
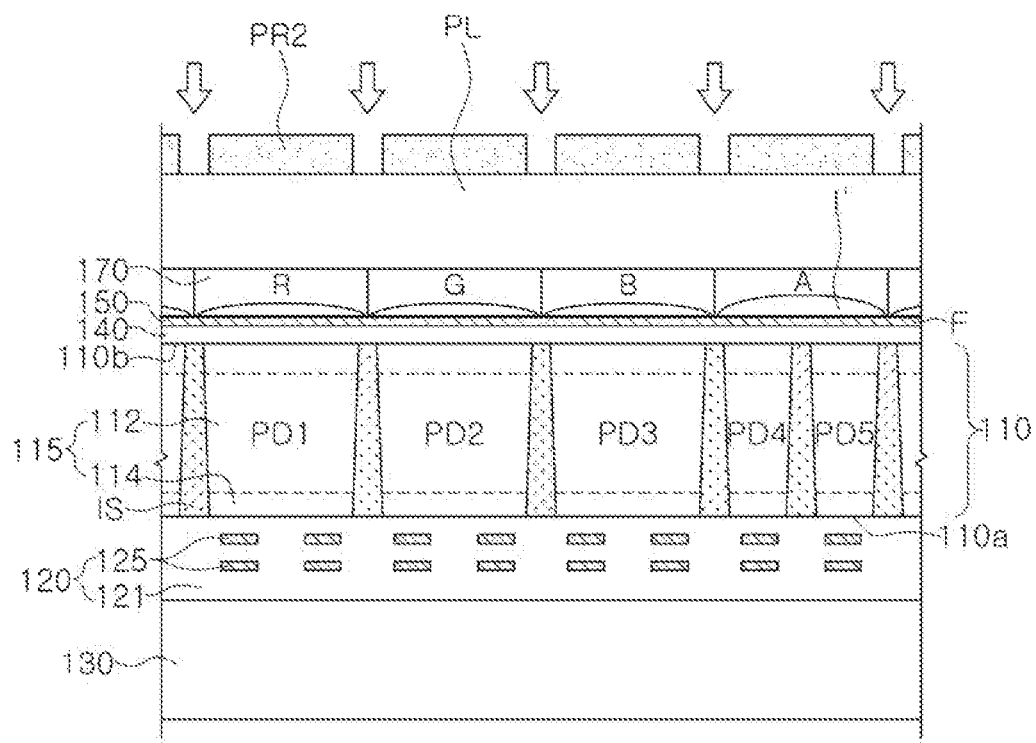
Figure 17:
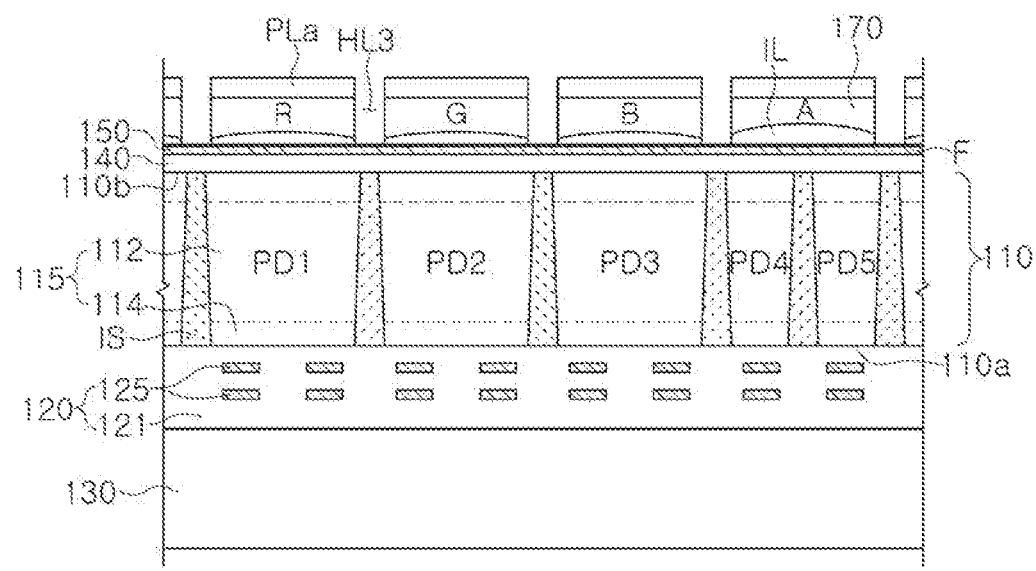

Next, as shown in FIG. 16, a planarization layer PL may be formed on the color filter 170, and a photoresist PR2 may be applied and masked on the planarization layer PL. Thereafter, when an etching process is performed, as shown in FIG. 17, a groove portion HL3 may be formed to divide each color filter 170 into unit pixel units. A remaining planarization layer PLa may remain on each of the color filters 170. The remaining planarization layer PLa may be used as a protective layer to prevent the color filter 170 from being etched when the etching process is performed in a subsequent process.

Figure 18:
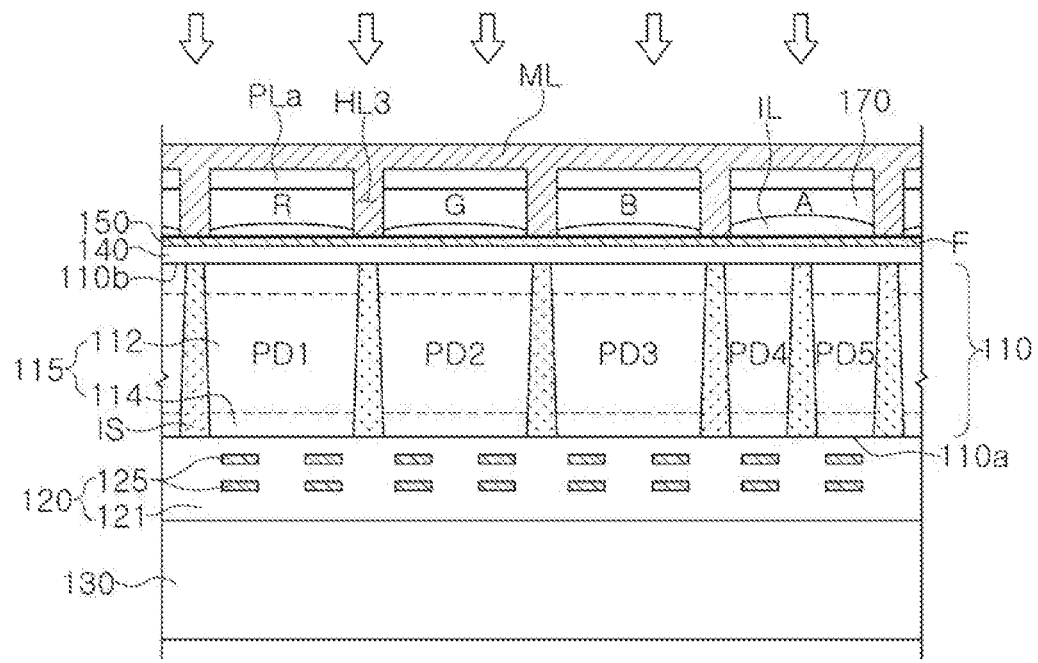

Next, as shown in FIG. 18, a light transmissive material layer ML may be formed to entirely cover the color filter 170 and fill the groove portion HL3. The light transmissive material layer ML may be formed of a low refractive index material having a refractive index of 1.3 or less. For example, the light transmissive material layer ML may be formed of a material such as SiO$_2$ or SiON.

Figure 19:
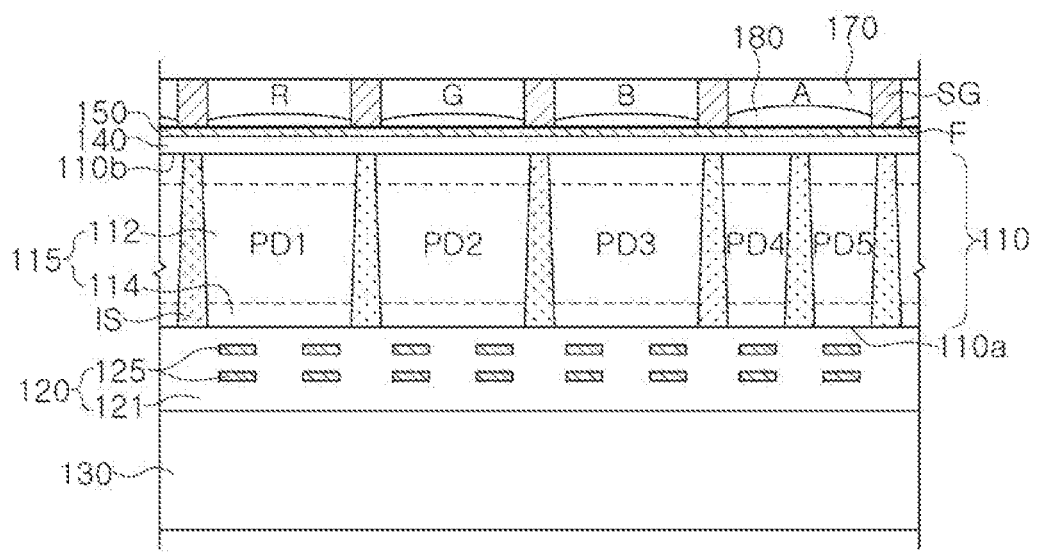

Next, as shown in FIG. 19, when the light transmissive material layer ML (see FIG. 18) is etched to a height at which the color filter 170 is exposed, a first grid pattern, which is a partition structure that isolates the color filters 170 from each other may be formed. Since the manufacturing process after FIG. 19 is the same as that of FIGS. 10 to 13 of the above-described example embodiment, a detailed description thereof will be omitted.

Figure 20:
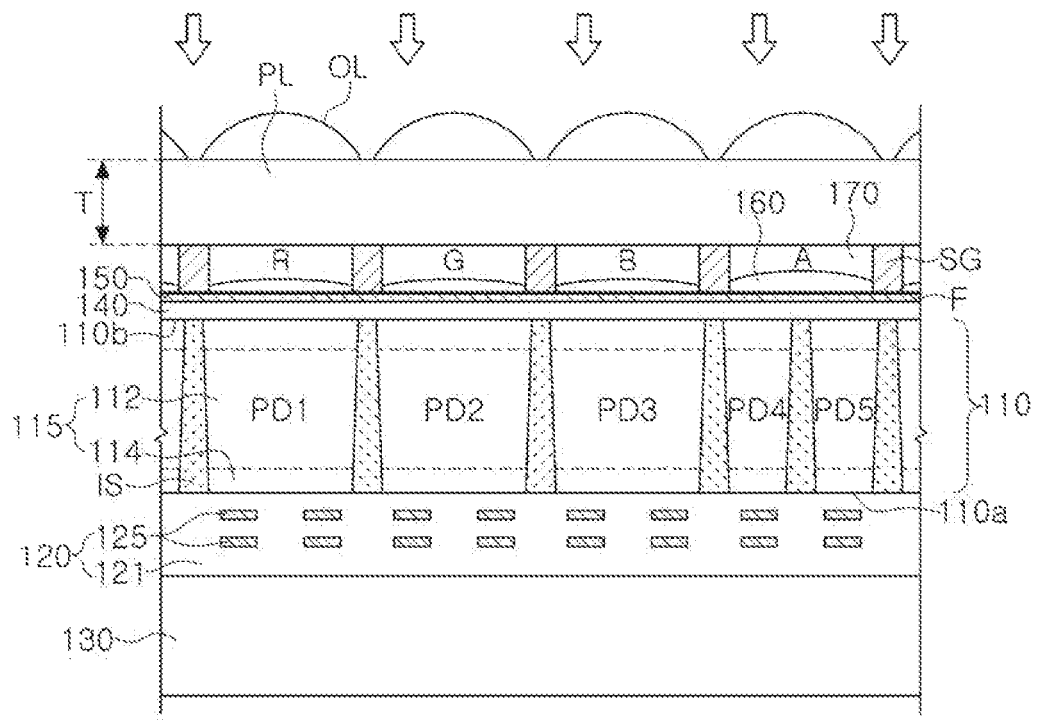
FIGS. 20, 21, and 22 are cross-sectional views of main processes of a manufacturing process of an image sensor according to an example embodiment.
Figure 21:
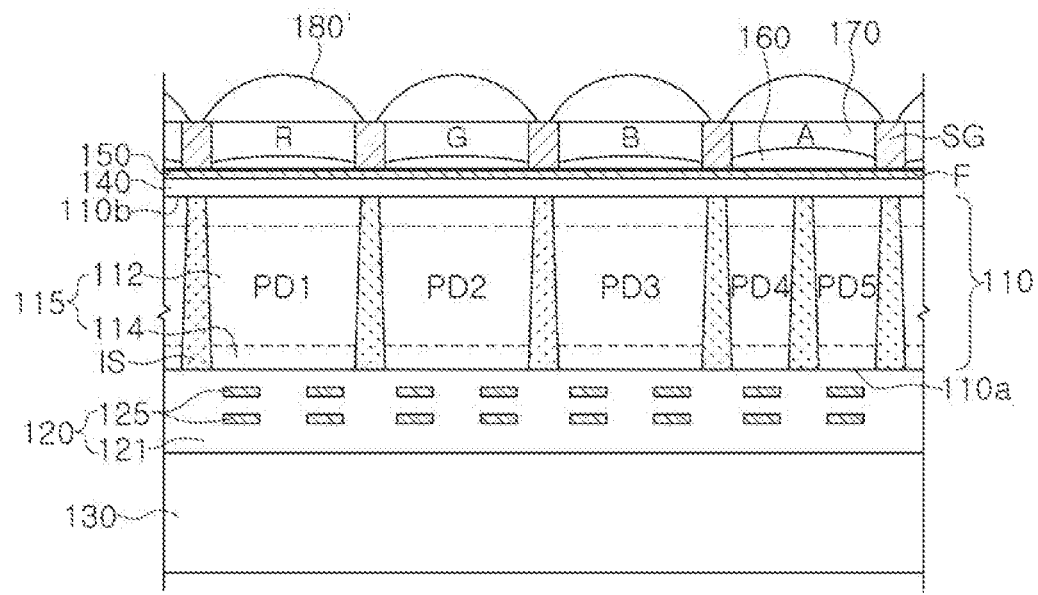
Figure 22:
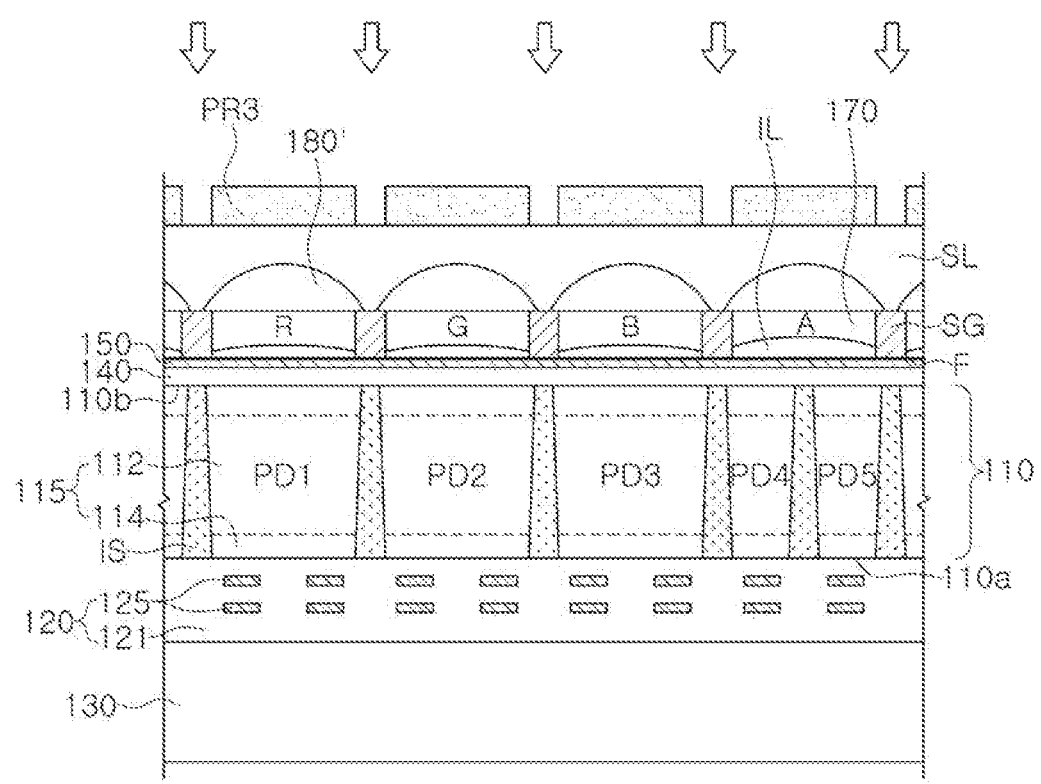

Next, a manufacturing process of the image sensor 100B of FIG. 5 described above will be described with reference to FIG. 20. FIGS. 20 to 22 are cross-sectional views of main processes of a manufacturing process of an image sensor according to an example embodiment. Since the manufacturing process before FIG. 20 is the same as that of FIGS. 14 to 19 of the above-described example embodiment, a detailed description thereof will be omitted.

First, as shown in FIG. 20, a planarization layer PL may be formed on the color filter 170, and a mask pattern OL having a microlens shape is formed on the planarization layer PL, and then an etching process is performed. The mask pattern OL having a microlens shape is for transferring the microlens to the planarization layer PL in a subsequent step. The planarization layer PL may be formed of a light transmissive material such as SiO$_2$, and may be formed to a thickness T of 2000 Å to 3000 Å.

When the etching process is performed, as illustrated in FIG. 21, the microlens shape of the mask pattern OL may be transferred to the planarization layer PL to form a second microlens 180'.

Next, as shown in FIG. 22, after forming a material layer SL to cover the second microlens 180', a photoresist PR3 may be applied and masked, and an etching process may be performed, such that the image sensor 100B of FIG. 5 can be manufactured. The material layer SL may be formed of a polymer or a metal oxide having a refractive index of 1.7 or more.

As set forth above, according to the example embodiments, an image sensor capable of improving accuracy of autofocusing by making a focal length of an image pixel of an image sensor different from a focal length of the a difference detection pixel may be provided.

While example embodiments have been shown and described above, it will be apparent to those skilled in the art that modifications and variations could be made without departing from the scope as defined by the appended claims.

What is claimed is:

1. An image sensor comprising:
    a semiconductor substrate comprising:
        a first surface;
        a second surface on which light is incident and disposed opposite to the first surface; and
        a plurality of pixel regions spaced apart from each other, the plurality of pixel regions comprising a first region comprising a plurality of image pixels configured to generate image data and a second region comprising a plurality of phase difference detection pixels configured to perform autofocusing;
    a first grid pattern comprising a plurality of groove portions disposed on the second surface corresponding to the plurality of pixel regions, respectively;
    a plurality of first microlenses selectively disposed on bottom surfaces of the plurality of groove portions corresponding to at least one of the first region and the second region;
    a plurality of color filters filling the plurality of groove portions, respectively;
    a second grid pattern superimposed on the first grid pattern; and
    a plurality of second microlenses separated by the second grid pattern, the plurality of second microlenses being disposed on the plurality of color filters, respectively,
    wherein the second grid pattern is disposed between adjacent second microlenses among the plurality of second microlenses at a level different from the plurality of color filters,
    wherein a width of the second grid pattern is smaller than a width of the first grid pattern and the width of the second grid pattern is substantially uniform in a cross-section, and
    wherein the plurality of first microlenses correspond to the plurality of second microlenses, respectively.

2. The image sensor of claim 1, wherein a first refractive index of the first grid pattern is lower than a second refractive index of the second grid pattern.

3. The image sensor of claim 2, wherein the first refractive index of the first grid pattern is less than or equal to 1.3.

4. The image sensor of claim 3, wherein the second refractive index of the second grid pattern is greater than or equal to 1.7.

5. The image sensor of claim 1, further comprising a cover layer covering the plurality of second microlenses and being in contact with the second grid pattern.

6. The image sensor of claim 5, wherein an end portion of the second grid pattern protrudes above the cover layer.

7. The image sensor of claim 6, wherein a material of the second grid pattern is same as a material of the cover layer.

8. The image sensor of claim 1, further comprising a fixed charge layer disposed between the first grid pattern and the semiconductor substrate and forming the bottom surfaces of the plurality of groove portions, the fixed charge layer comprising hafnium dioxide ($HfO_2$).

9. The image sensor of claim 8, further comprising an insulating layer comprising aluminum oxide ($Al_2O_3$) disposed on side surfaces of the first grid pattern and the bottom surfaces of the plurality of groove portions formed by the fixed charge layer.

10. The image sensor of claim 8, further comprising a metal barrier layer disposed between the fixed charge layer and the semiconductor substrate, and formed of titanium (Ti)/titanium nitride (TiN).

11. The image sensor of claim 1, wherein the plurality of first microlenses are in contact with a side surface of the first grid pattern, respectively, and wherein the plurality of second microlenses are in contact with a side surface of the second grid pattern, respectively.

12. An image sensor comprising:
a semiconductor layer comprising a plurality of pixel regions respectively comprising a photoelectric conversion portion, the plurality of pixel regions comprising a first region comprising a plurality of image pixels configured to generate image data and a second region comprising a plurality of phase difference detection pixels configured to perform autofocusing;
a plurality of color filters disposed on the semiconductor layer corresponding to the plurality of pixel regions, respectively;
a plurality of first microlenses disposed between the semiconductor layer and the plurality of color filters, and corresponding to the plurality of pixel regions, respectively;
a first grid pattern disposed on the semiconductor layer and separating the plurality of first microlenses;
a plurality of second microlenses disposed on the plurality of color filters opposite to the plurality of first microlenses and corresponding to the plurality of pixel regions, respectively; and
a second grid pattern disposed between adjacent second microlenses among the plurality of second microlenses at a level different from the plurality of color filters,
wherein the plurality of first microlenses comprise a first group disposed in the first region and having a first focal length and a second group disposed in the second region and having a second focal length that is different from the first focal length,
wherein a width of the second grid pattern is smaller than a width of the first grid pattern and the width of the second grid pattern is substantially uniform in a cross-section, and
wherein the plurality of first microlenses correspond to the plurality of second microlenses, respectively.

13. The image sensor of claim 12, wherein the first grid pattern comprises a plurality of groove portions disposed corresponding to the plurality of pixel regions, respectively.

14. The image sensor of claim 13, wherein the plurality of second microlenses are separated by the second grid pattern disposed overlapping the first grid pattern.

15. The image sensor of claim 14, wherein the first grid pattern has a first refractive index, and the second grid pattern has a second refractive index that is higher than the first refractive index.

16. The image sensor of claim 15, wherein the first grid pattern comprises at least one material selected from silicon dioxide ($SiO_2$), silicon oxynitride (SiON), aluminum oxide ($Al_2O_3$), hafnium dioxide ($HfO_2$), tantalum oxide ($Ta_2O_5$) and zirconium dioxide ($ZrO_2$), and wherein the second grid pattern comprises a polymer or a metal oxide.

17. An image sensor comprising:
a semiconductor substrate comprising a plurality of pixel regions spaced apart from each other, and comprising a first surface and a second surface on which light is incident and opposite to the first surface, the plurality of pixel regions comprising an image detection region configured to generate image data and a phase difference detection region configured to perform autofocusing;
a first grid pattern comprising a plurality of groove portions disposed on the second surface of the semiconductor substrate corresponding to the plurality of pixel regions, respectively;
a plurality of first microlenses disposed in the plurality of groove portions;
a plurality of color filters disposed on the plurality of first microlenses, respectively, in the plurality of groove portions;
a plurality of second microlenses disposed on the plurality of color filters, the plurality of second microlenses being spaced apart from each other and corresponding to the plurality of pixel regions, respectively; and
a second grid pattern disposed between adjacent second microlenses among the plurality of second microlenses at a level different from the plurality of color filters,
wherein the plurality of first microlenses comprise a first group disposed in the image detection region and having a first focal length, and a second group disposed in at least part of the phase difference detection region and having a second focal length that is different from the first focal length,
wherein a width of the second grid pattern is smaller than a width of the first grid pattern and the width of the second grid pattern is substantially uniform in a cross-section, and
wherein the plurality of first microlenses correspond to the plurality of second microlenses, respectively.

18. The image sensor of claim 17, further comprising a light transmissive protective layer filling a space between the plurality of second microlenses, and covering surfaces of the plurality of second microlenses.

19. The image sensor of claim 17, wherein a portion of each second microlens of the plurality of second microlenses overlap the first grid pattern.

20. The image sensor of claim 17, wherein a second diameter of each of the plurality of second microlenses is smaller than a first diameter of each of the plurality of first microlenses.

* * * * *